(12) United States Patent
Nakashiba

(10) Patent No.: US 6,573,937 B1
(45) Date of Patent: Jun. 3, 2003

(54) SOLID IMAGE PICK-UP DEVICE HAVING UNNECESSARY CHARGE DISCHARGING SECTION

(75) Inventor: Yasutaka Nakashiba, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/082,798

(22) Filed: May 21, 1998

(30) Foreign Application Priority Data

May 23, 1997 (JP) .............................. 9-150407

(51) Int. Cl.[7] .......................... H04N 3/14; H01L 29/768
(52) U.S. Cl. ...................................... 348/314; 257/215
(58) Field of Search ................................ 257/229, 291, 257/242, 245, 215, 219, 223, 230, 232; 348/294, 299, 311, 314

(56) References Cited

U.S. PATENT DOCUMENTS

| 4,168,444 | A | * | 9/1979 | van Santen | 257/230 |
|---|---|---|---|---|---|
| 5,182,623 | A | * | 1/1993 | Hynecek | 257/230 |
| 5,528,291 | A | * | 6/1996 | Oda | 348/220 |
| 5,565,374 | A | * | 10/1996 | Fukusho | 257/223 |
| 5,619,049 | A | * | 4/1997 | Kim | 257/223 |
| 5,770,870 | A | * | 6/1998 | Nakashiba | 257/230 |
| 5,774,182 | A | * | 6/1998 | Mutoh et al. | 348/311 |
| 5,796,432 | A | * | 8/1998 | Iesaka et al. | 348/311 |
| 5,990,953 | A | * | 11/1999 | Nakashiba | 348/314 |

OTHER PUBLICATIONS

Ishihara et al., "Vertical Overflow Structure CCD Image Sensor", *Institute of Television Engineers of Japan*, vol. 37, No. 10, 1983, pp. 782–787.

* cited by examiner

*Primary Examiner*—Wendy R. Garber
*Assistant Examiner*—Rashawn N. Tillery
(74) *Attorney, Agent, or Firm*—Sughrue Mion, PLLC

(57) ABSTRACT

A semiconductor well layer of second conductive type formed at the surface of a semiconductor substrate of first conductive type. First device isolation areas formed at the surface of the semiconductor well layer. A plurality of photoelectric conversion sections are formed in the first device isolation areas, and an output circuit section is formed at a second device isolation area in contact with the first device isolation areas. The second device isolation area has an impurity density higher than that of the semiconductor well layer. Further, a plurality of third device isolation areas of second conductive type having an impurity density higher than that of the semiconductor well layer are formed in contact with the second device isolation area, between a horizontal charge transfer section and a unnecessary charge discharging section.

10 Claims, 15 Drawing Sheets

SOLID IMAGE PICK-UP DEVICE HAVING UNNECESSARY CHARGE DISCHARGING SECTION

BACKGROUND OF THE INVENTION

1. Field of the Invention

The present invention relates to a solid image pick-up device to be used as an input unit for a camera-integrated VTR (Video Tape Recorder), an electronic still camera or the like, and relates more particularly to a solid image pick-up device having an unnecessary charge discharging section formed adjacent to a horizontal charge transfer section.

2. Description of the Related Art

Recently, there has been progressed a diversification of a solid image pick-up device to be used as an input unit for a camera-integrated VTR. Further, a solid image pick-up device has come to be used as an input unit for an electronic still camera for producing a hard copy or an electronic still camera for producing a picture for observation on the screen, by converting optical information into an electric signal and storing this electric signal in a recording medium, in stead of exposing a film.

Such a solid image pick-up device has a photoelectric conversion section for converting an optical signal into an electric signal and a charge transfer section for transferring a signal charge stored in the photoelectric conversion section into a vertical direction and a horizontal direction. However, in addition to a signal charge which is essential as a video signal, there also exist unnecessary signal charges such as a charge photoelectrically converted during an unnecessary period and a charge due to a current generated from a silicon oxide film interface.

When a solid image pick-up device is used as an input unit for a camera-integrated VTR, unnecessary signal charges are settled at an insignificant level after images of a few screens are displayed, causing no large problem. However, when the solid image pick-up device is used as an input unit for an electronic still camera, unnecessary signal charges are superimposed on a signal charge as a primary video signal, thus causing a deterioration in the picture quality.

Further, in the case of taking time for removing an unnecessary signal charge, a time delay is generated until a shutter operation is actually performed after a shutter button is pressed to transmit a signal to take a shuttering action. As a result, there is a problem that a shutter chance may be lost.

Accordingly, unlike the case of using a solid image pick-up device as an input unit for a camera-integrated VTR, the solid image pick-up device when used as an input unit for an electronic still camera needs to remove instantaneously all the unnecessary signal charges existing in the photoelectric conversion section and the vertical and horizontal charge transfer sections at the same time when the shutter button is pressed to transmit a shuttering signal.

As a method for removing unnecessary charges, there has been described a method for removing unnecessary charges existing in the photoelectric conversion section in, for example, "Vertical Overflow Structure CCD Image Sensor", by Ishihara et al., a publication of the Institute of Television Engineers of Japan, Vol. 37, No. 10 (1983), pp. 782–787. This is a method for forming a low density $P^-$-type semiconductor area beneath an N-type semiconductor area for structuring a photoelectric conversion section and applying an inverse bias voltage to an N-type semiconductor substrate to deplete the $P^-$-type semiconductor area. By this method, a vertical overflow drain structure is formed for restricting a blooming by moving a surplus charge to the N-type semiconductor substrate and removing all the signal charge to the N-type semiconductor substrate, thereby removing the unnecessary charges existing in the photoelectric conversion section.

Further, since a high-speed operation is possible for a horizontal charge transfer section, as a method for removing unnecessary charges existing in the horizontal charge transfer section, there is employed a method for moving the unnecessary charges to a reset drain provided at the end of the horizontal charge transfer section by a normal operation.

On the other hand, as a method for removing unnecessary charges existing in a vertical charge transfer section, there is a method for transferring the unnecessary charges of the vertical charge transfer section to an unnecessary charge discharging section in a forward direction.

However, according the conventional solid image pick-up device, it is not possible to remove efficiently the unnecessary charges existing in the vertical charge transfer section.

SUMMARY OF THE INVENTION

It is an object of the present invention to provide a solid image pick-up device having an unnecessary charge discharging section which can remove efficiently unnecessary charges existing in a vertical charge transfer section.

A solid image pick-up device having an unnecessary charge discharging section according to the present invention comprises a semiconductor substrate of first conductive type. A semiconductor well layer of second conductive type is formed at the surface of the semiconductor substrate. First device isolation areas of second conductive type are formed at the surface of the semiconductor well layer. A plurality of photoelectric conversion sections are formed at the first device isolation areas. The photoelectric conversion sections are converting optical information into electric signals. There are formed a vertical charge transfer section for transferring charges in a vertical direction out of the electric signals converted by the photoelectric conversion sections and a horizontal charge transfer section for transferring charges in a horizontal direction out of the electric signals converted by the photoelectric conversion sections. A second device isolation area of second conductive type is formed in contact with the first device isolation areas. The second device isolation area has an impurity density higher than that of the semiconductor well layer. An output circuit section is formed at the second device isolation area. The output circuit section outputs charges transferred by the vertical charge transfer section and the horizontal charge transfer section. An unnecessary charge discharging section is formed at a side of the horizontal charge transfer section opposite to the vertical charge transfer section. The unnecessary charge discharging section discharges unnecessary charges of the vertical charge transfer section and the horizontal charge transfer section. A third device isolation area of second conductive type is formed in contact with the second device isolation area between the horizontal charge transfer section and the unnecessary charge discharging section. The third device isolation area has an impurity density higher than that of the semiconductor well layer. A potential barrier section determines electric potential between the horizontal charge transfer section and the unnecessary charge discharging section.

This solid image pick-up device may have an insulation film formed on the potential barrier section and the unnecessary charge discharging section, and a horizontal charge transfer electrode formed on the insulation film.

A semiconductor area of first conductive type structuring a buried channel of the horizontal charge transfer section may be formed at the surface of the semiconductor substrate in the area where the unnecessary charge discharging section is formed. Further, the impurity density of the first device isolation areas may be equal to that of the third device isolation area.

It is preferable that a potential difference between the voltage applied to the unnecessary charge discharging section and the electric potential of the potential barrier section is 0.5 V or above. However, this potential difference does not need to be 0.5 V or above.

Further, the third device isolation area may have a projection extending to the second device isolation area. The projection may be in contact with the second device isolation area. Further, the second device isolation area may have a projection extending to the third device isolation area. The projection may be in contact with the third device isolation area.

A plurality of the third device isolation areas may be separated in a direction to which the horizontal charge transfer section extends. The electric potential of the potential barrier section may be determined by narrow channel effect of said third device isolation area. A reference voltage may be supplied to the second device isolation area.

According to the present invention, as the third device isolation area for determining the electric potential of the potential barrier section and the second device isolation area in which the output circuit section is formed are connected together. The second device isolation area and the third device isolation area have impurity density higher than that of the semiconductor well layer. Accordingly, it is possible to supply an electric potential directly to the third device isolation areas through the low-resistance second device isolation area when a voltage is applied to the electrode of the horizontal charge transfer section. Therefore, a solid image pick-up device which can remove efficiently unnecessary charges existing in a vertical charge transfer section is provided. Also, it is possible to restrict the electric potential of the third device isolation area for determining the electric potential of the potential barrier section from being modulated, thus stabilizing the electric potential. As a result, according to the present invention, it is possible to prevent a reduction of the charge transfer capacity of the horizontal charge transfer section determined by the difference between the electric potential of a charge storage area of the horizontal charge transfer section and the electric potential of the potential barrier section.

DETAILED DESCRIPTION OF THE PREFERRED EMBODIMENTS

Figure 1:
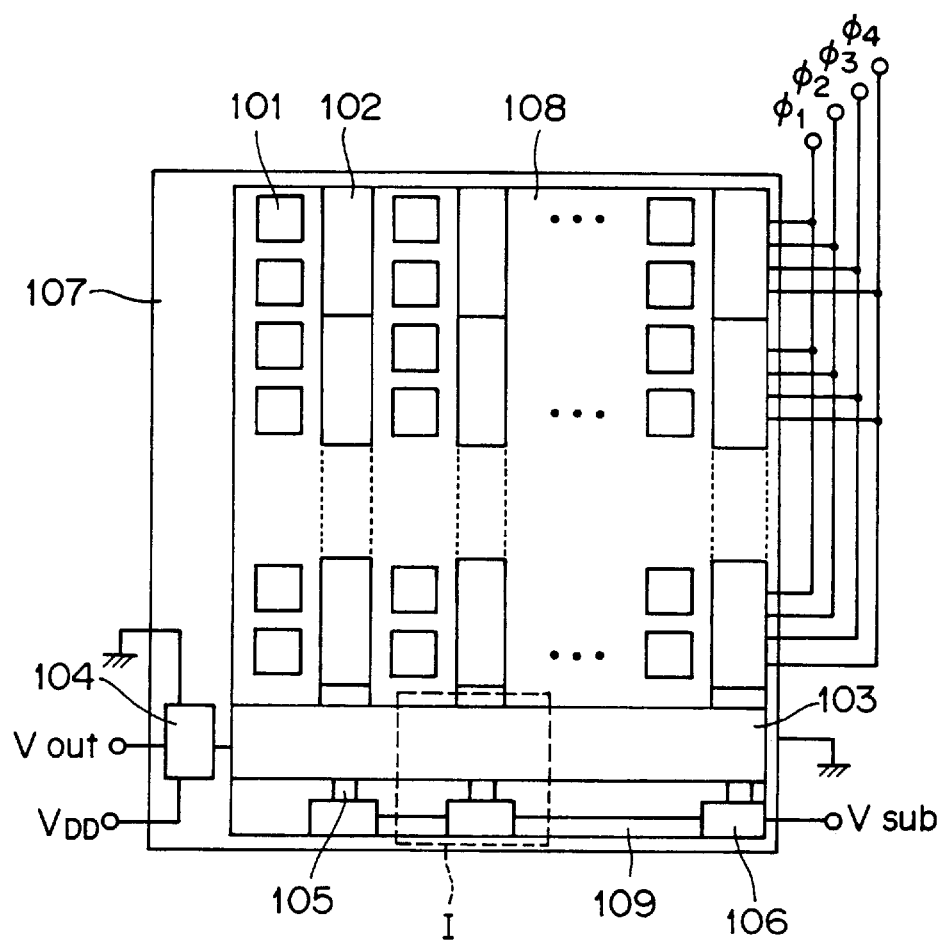
FIG. 1 is a plan view for showing a solid image pick-up device having an unnecessary charge discharging section according to a first embodiment of the present invention.
Figure 2:
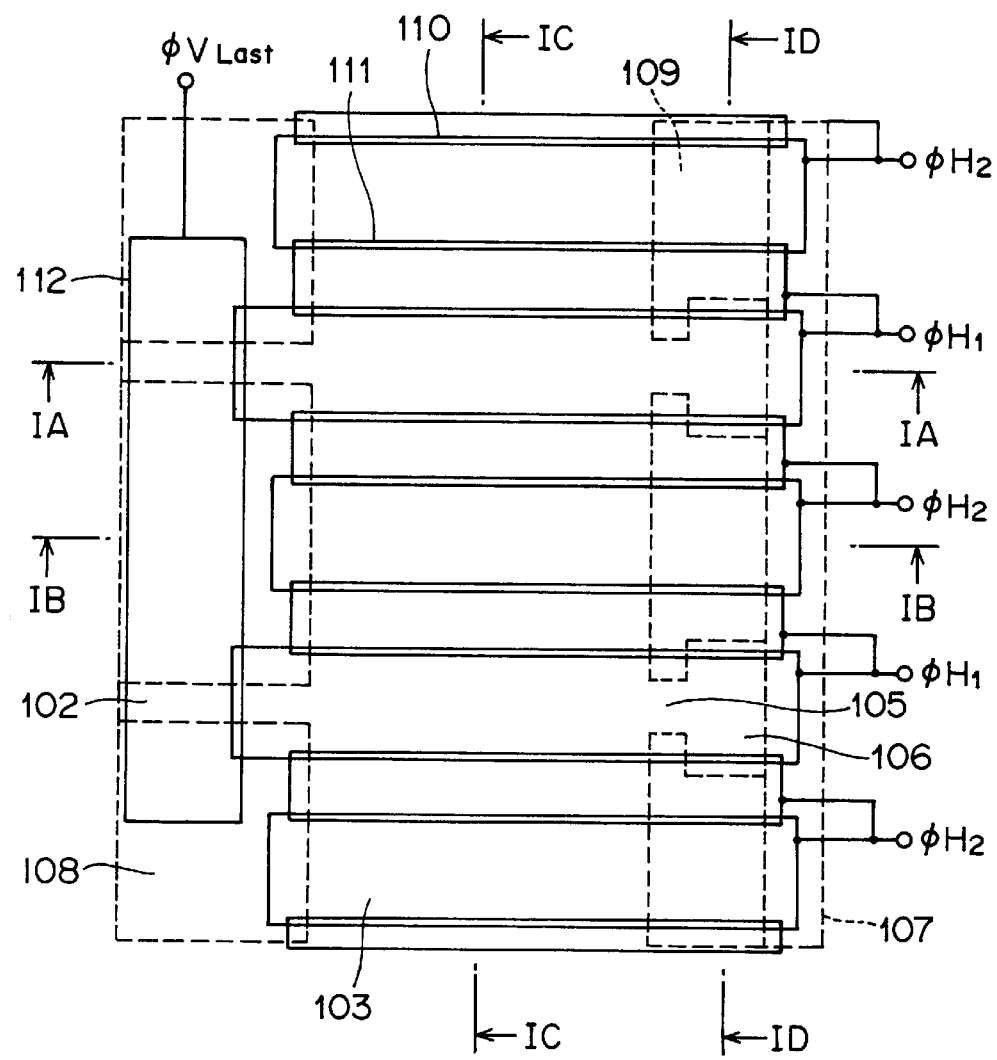
FIG. 2 is a plan view for showing an enlarged I section of the solid image pick-up device having the unnecessary charge discharging section according to the first embodiment of the present invention.

Embodiments of the present invention will be explained in detail with reference to the attached drawings. FIG. 1 is a plan view for showing a solid image pick-up device having an unnecessary charge discharging section according to a first embodiment of the present invention, and FIG. 2 is a plan view for showing an enlarged I section thereof. As shown in FIGS. 1 and 2, a plurality of photoelectric conversion sections 101 for converting optical information into electric signals are laid out in a lattice shape at the surface of a semiconductor substrate. Between adjacent columns of the lattice-shaped photoelectric conversion sections 101, there is formed a vertical charge transfer section 102 for transferring a charge in a column direction (vertical direction) out of the electric signals output from the photoelectric conversion sections 101. The vertical charge transfer section 102 has a plurality of vertical charge transfer electrodes (not shown) laid out in a vertical direction. Further, there is formed a horizontal charge transfer section 103 for transferring a charge in a row direction out of the electric signals output from the photoelectric conversion sections 101, adjacent to one end section of the vertical charge transfer section 102.

The horizontal charge transfer section 103 has first horizontal charge transfer electrodes 110 and second horizontal charge transfer electrodes 111 arranged alternately. Parts of these horizontal charge transfer electrodes are connected to a vertical charge transfer electrode at the end out of a plurality of vertical charge transfer electrodes 112, thus structuring a vertical horizontal connection section. Further, an output circuit section 104 for outputting charges transferred by the vertical charge transfer sections 102 and the horizontal charge transfer sections 103 is formed adjacent to one end of the horizontal charge transfer section 103. Further, an unnecessary charge discharging section 106 into which charges not required in the vertical charge transfer section 102 and the horizontal charge transfer section 103 are discharged is formed corresponding to each vertical charge transfer section 102 adjacent to the horizontal charge transfer section 103.

The photoelectric conversion sections 101 are formed in a plurality of first device isolation areas 108, and the output circuit section 104 is formed within a second device isolation area 107. A plurality of third device isolation areas 109 are formed in a state of being laid out in a horizontal direction, between the horizontal charge transfer section 103 and the unnecessary charge discharging section 106, and there is provided a potential barrier section 105 for electrically separating the horizontal charge transfer section 103 from the unnecessary charge discharging section 106 by a narrow channel effect between the plurality of device separation areas 109.

Figure 3A:
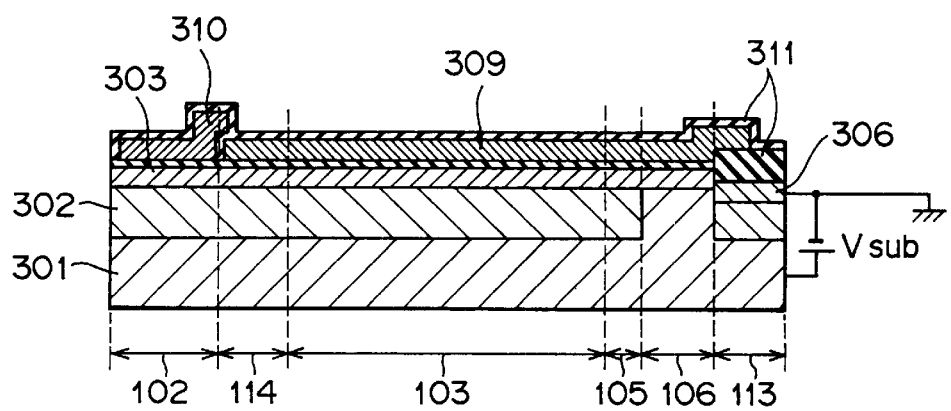
FIG. 3A is a cross sectional view along the line IA—IA in FIG. 2.
Figure 3B:
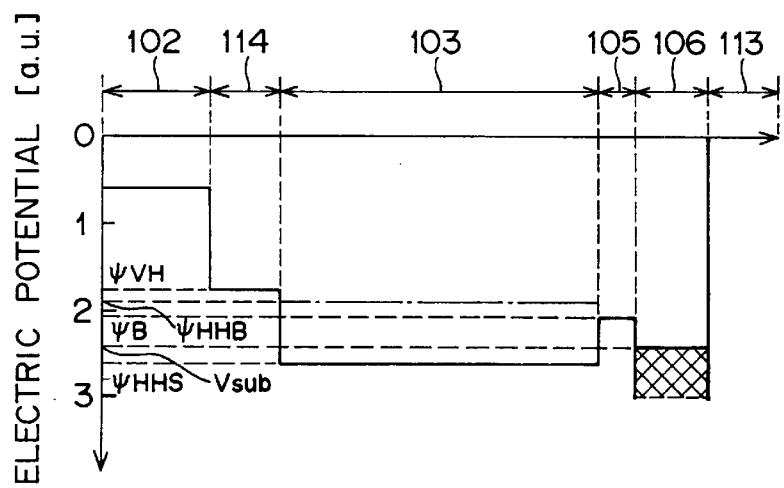
FIG. 3B is a schematic view for showing an electric potential in an area shown in FIG. 3A.

FIG. 3A is a cross sectional view along the line IA—IA in FIG. 2, and FIG. 3B is a schematic view for showing an electric potential in an area shown in FIG. 3A. As shown in FIG. 3A, in the area of the surface of an N$^{--}$-type semiconductor substrate 301 having an impurity density of about 2.0×10$^{14}$ cm$^{-3}$ excluding an area for structuring the unnecessary charge discharging section 106, a P-type well layer 302 with an impurity density of about 1.0×10$^{16}$ is selectively formed. Further, at the surfaces of the P-type well layer 302 and the N$^{--}$-type semiconductor substrate 301, an N-type semiconductor area 303 for structuring a buried channel for the vertical charge transfer section 102, the horizontal charge transfer section 103 and the potential barrier section 105 is formed with an impurity density of about 1.0×10$^{17}$ cm$^{-3}$.

Further, a first P$^+$-type semiconductor area 306 for structuring the second device isolation area 107 with an impurity density of about 1.0×10$^{18}$ cm$^{-3}$ is formed at the surface of the P-type well layer 302 in an area where the N-type semiconductor area 303 is not formed, and this area becomes a pass line wiring forming area 113. Further, an insulation film 311 is formed on the first P$^+$-type semiconductor area 306 and the N-type semiconductor area 303. Further, on the insulation film 311, there is selectively formed the first horizontal charge transfer electrode 110 made of a first polycrystalline silicon film 309, and the insulation film 311 is also formed on the surface of the first horizontal charge transfer electrode 110. On the insulation film 311 in the area where the first horizontal charge transfer electrode 110 is not formed, the vertical charge transfer electrode 112 at the end made of a second polycrystalline silicon film 310 is formed, and the insulation film 311 is formed on this surface. The first horizontal charge transfer electrode 110 and the vertical charge transfer electrode 112 at the end match together in a slight area through the insulation film 311.

A voltage Vsub is applied between the N-type semiconductor area 303 for structuring the unnecessary charge discharging section 106 and the N$^{--}$-type semiconductor substrate 301 so that the electric potential of the unnecessary charge discharging section 106 is lower than an electric potential ΨB of the potential barrier section 105. In this case, it is preferable that the potential difference between the voltage Vsub and the electric potential ΨB is 0.5 V or above.

Figure 4A:
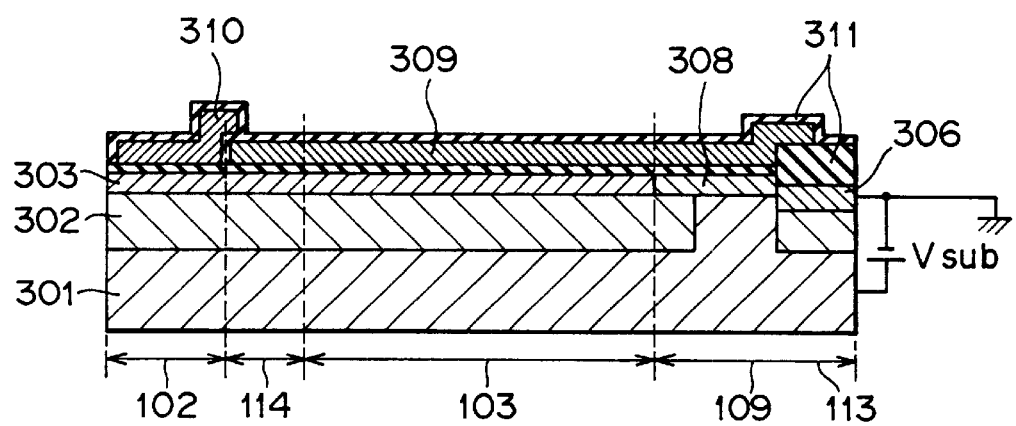
FIG. 4A is a cross sectional view along the line IB—IB in FIG. 2.
Figure 4B:
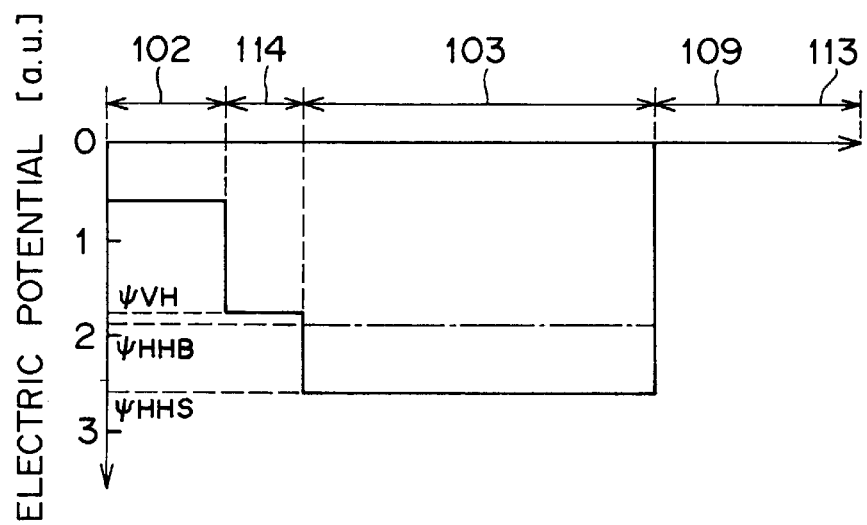
FIG. 4B is a schematic view for showing an electric potential in an area shown in FIG. 4A.

FIG. 4A is a cross sectional view along the line IB—IB in FIG. 2, and FIG. 4B is a schematic view for showing an electric potential in an area shown in FIG. 4A. The cross sectional view of FIG. 4A is different from that of FIG. 3A in that at the surface of the P-type well layer 302, there is formed a third P$^+$-type semiconductor area 308 for selectively structuring third device isolation areas 109 with an impurity density of about 1.0×10$^{18}$ cm$^{-3}$, in stead of the N-type semiconductor area 303. The third device isolation areas 109 are formed in contact with the second device isolation area 107.

In a manner similar to that applied in the area shown in FIG. 3A, a voltage Vsub is applied between the N-type semiconductor area 303 for structuring the unnecessary charge discharging section 106 and the N$^{--}$-type semiconductor substrate 301 so that the electric potential of the unnecessary charge discharging section 106 is lower than an electric potential ΨB of the potential barrier section 105. In this case, it is preferable that the potential difference between the voltage Vsub and the electric potential ΨB is 0.5 V or above.

Figure 5A:
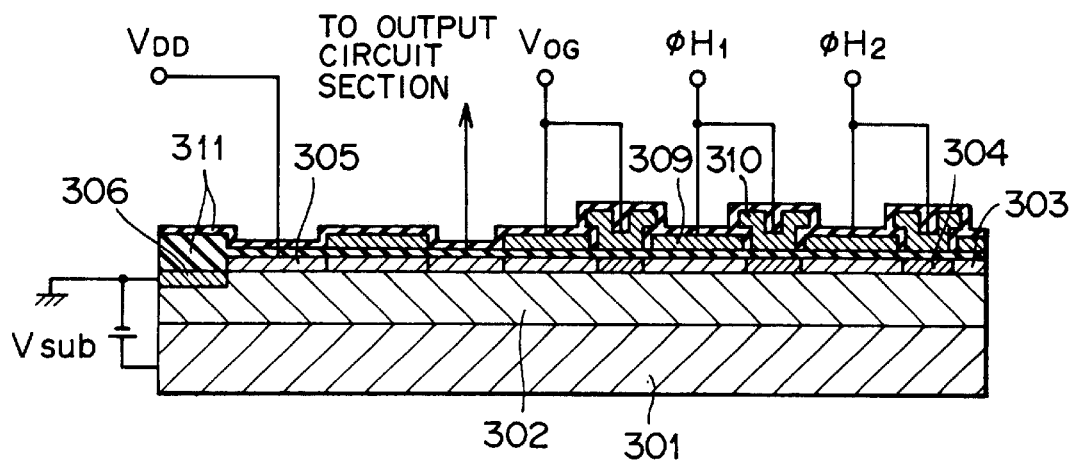
FIG. 5A is a cross sectional view along the line IC—IC in FIG. 2.
Figure 5B:
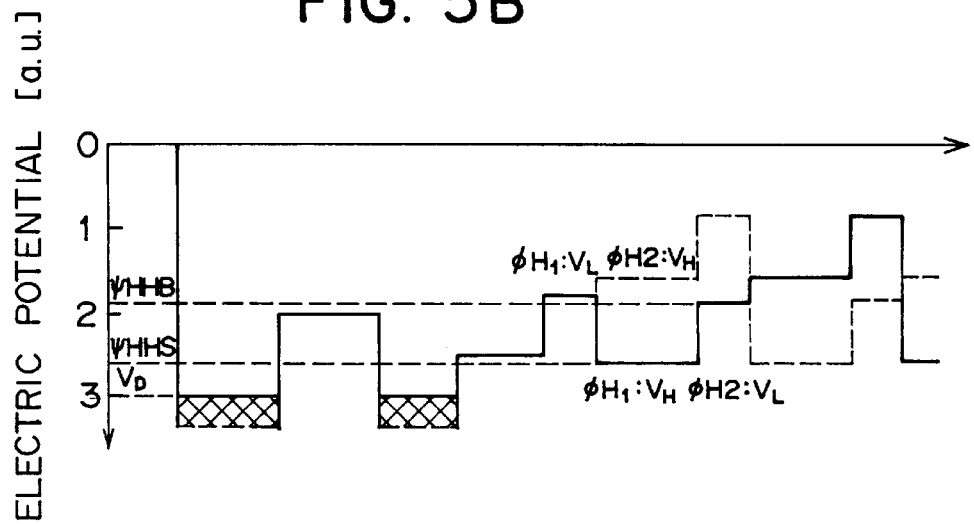
FIG. 5B is a schematic view for showing an electric potential in an area shown in FIG. 5A.

FIG. 5A is a cross sectional view along the line IC—IC in FIG. 2, and FIG. 5B is a schematic view for showing an electric potential in an area shown in FIG. 5A. As shown in FIG. 5A, the P-type well layer 302 is formed at the surface of the N$^{--}$-type semiconductor substrate 301. Further, at the surface of the P-type well layer 302, there are selectively formed the N-type semiconductor area 303 for structuring a buried channel for the vertical charge transfer section 102, the horizontal charge transfer section 103 and the potential barrier section 105 and an N$^-$-type semiconductor area 304 with an impurity density of about 7.0×10$^{16}$ cm$^{-3}$. Further, an N$^+$-type semiconductor area 305 for structuring a floating diffused area and a reset drain section is formed at the surface of the P-type well layer 302.

Further, the first P$^+$-type semiconductor area 306 for structuring the second device isolation area 107 is formed at the surface of the P-type well layer 302 in an area where the semiconductor areas 303, 304 and 305 are not formed. The insulation film 311 is formed on the surface of the semiconductor areas 303, 304 and 305 and the first P$^+$-type semiconductor area 306. Further, on the insulation film 311 in an area which matches with the N-type semiconductor area 303, there is formed the first polycrystalline silicon film 309 for forming the first horizontal charge transfer electrode 110 together with the first P$^+$-type semiconductor area 306. On the insulation film 311 in the area which matches with the N$^-$-type semiconductor area 304, there is formed the second polycrystalline silicon film 310 for structuring the second horizontal charge transfer electrode 111.

A power supply voltage VDD of about 15 V is usually applied to the N$^+$-type semiconductor area 305 for structuring a reset drain of a signal charge.

Figure 6A:
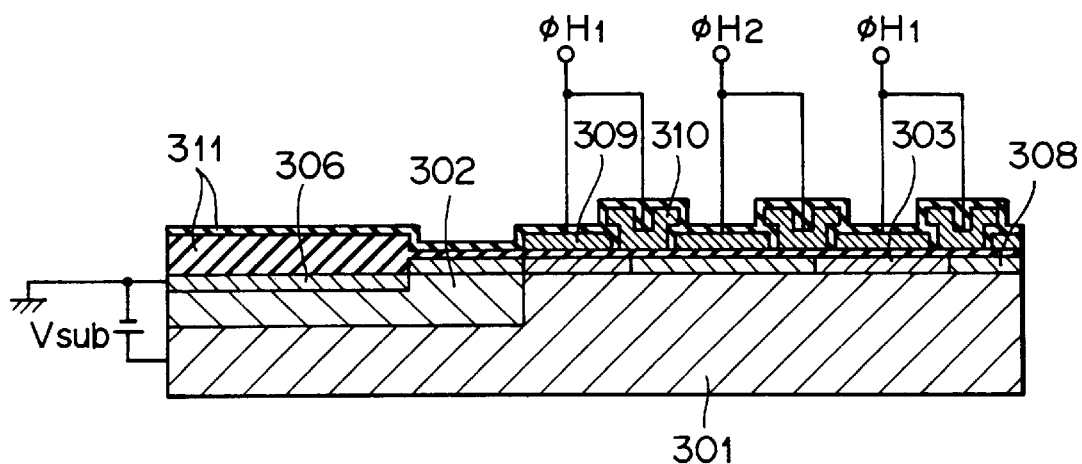
FIG. 6A is a cross sectional view along the line ID—ID in FIG. 2.
Figure 6B:
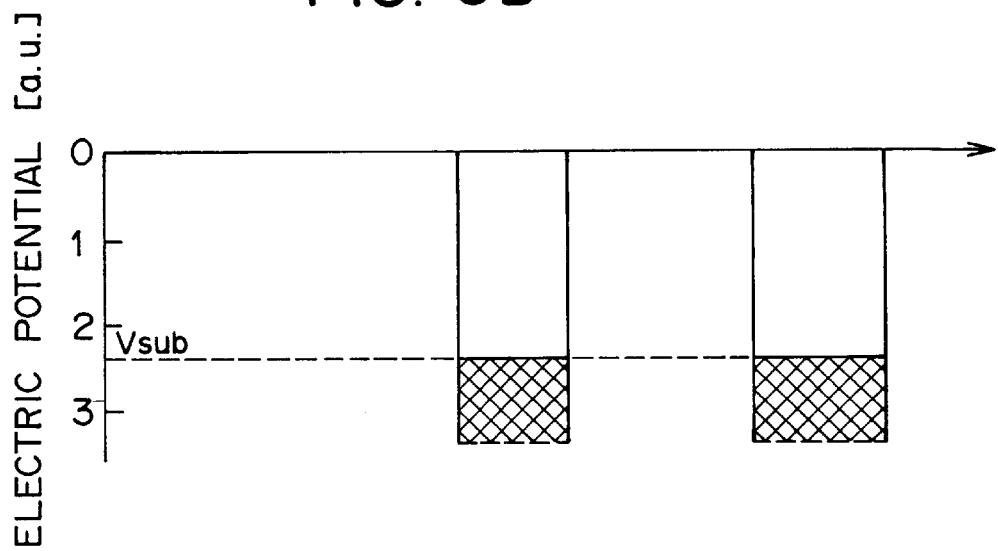
FIG. 6B is a schematic view for showing an electric potential in an area shown in FIG. 6A.

FIG. 6A is a cross sectional view along the line ID—ID in FIG. 2, and FIG. 6B is a schematic view for showing an electric potential in an area shown in FIG. 6A. As shown in FIG. 6A, at the surface of the N$^{--}$-type semiconductor substrate 301, there are formed the P-type well layer 302, the N-type semiconductor area 303 for structuring the unnecessary charge discharging section together with the N$^{--}$-type semiconductor substrate 301, and the third P$^+$-type semiconductor area 308 for structuring the third device isolation areas 109. At the surface of the P-type well layer 302, there are selectively formed the first P$^+$-type semiconductor area 306 for structuring the second device isolation area 107 and the third P$^+$-type semiconductor area 308 for structuring the third device isolation areas 109. Further, the insulation film 311 is formed on the whole surface. On the insulation film 311 in an area which matches with the N-type semiconductor area 303 and the third P⁺-type semiconductor area 308, there are alternately formed the first horizontal charge transfer electrode 110 consisting of the first polycrystalline silicon film 309 and the second horizontal charge transfer electrode 111 consisting of the second polycrystalline silicon film 310.

As described above, the voltage Vsub is being applied between the N-type semiconductor area 303 for structuring the unnecessary charge discharging section 106 and the N⁻⁻-type semiconductor substrate 301.

According to the first embodiment having the above-described structure, a P⁻-type semiconductor area with a low density is formed beneath the N-type semiconductor area for structuring the photoelectric conversion sections 101. Then, the N-type semiconductor area itself is depleted by applying an inverse bias voltage larger than the power supply voltage $V_{DD}$ of about 15 V to the N⁻⁻-type semiconductor substrate 301, thereby to shift all the signal charges to the N⁻⁻-type semiconductor substrate 301. With this arrangement, unnecessary charges existing in the photoelectric conversion sections 101 are removed.

Figure 7:
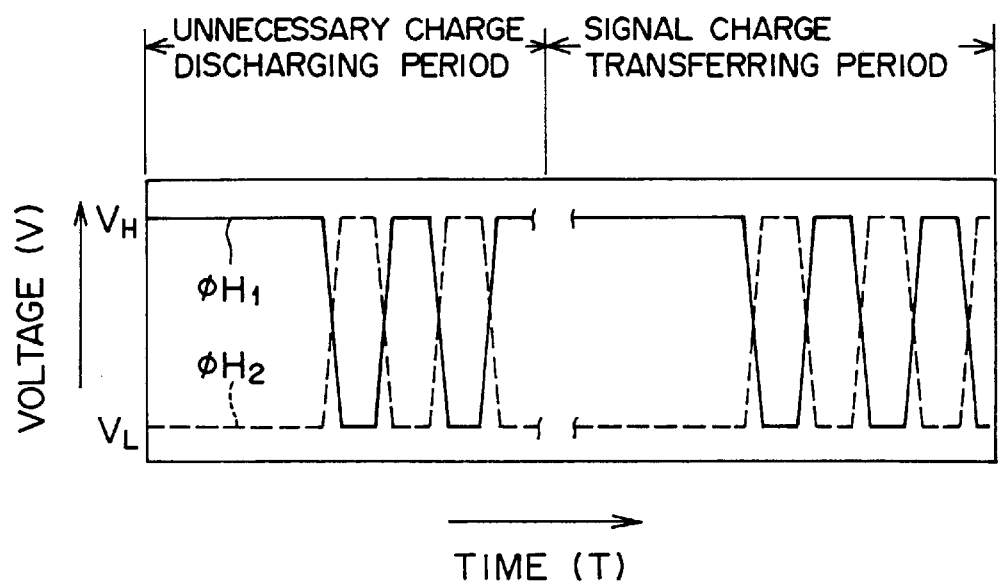
FIG. 7 is a schematic view for showing one example of a clock pulse applied to a horizontal charge transfer section of a solid image pick-up device.

With the above-described operation, all the unnecessary charges existing in the vertical charge transfer section 102 are transferred together to the horizontal charge transfer section 103 in a four-phase clock pulse, for example. In this case, a high-level voltage $V_H$ is being applied to $\Phi H_1$ and a low-level voltage $V_L$ is being applied to $\Phi H_2$ in the horizontal charge transfer electrodes 110 and 111 as shown in FIG. 7. A surplus charge that cannot be stored in the horizontal charge transfer section 103 exceeds the electric potential $\Psi B$ of the potential barrier section 105 formed to be lower than an electric potential $\Psi VH$ formed in a vertical and horizontal connection section 114, and is removed by being absorbed by the N⁻⁻-type semiconductor substrate 301 through the N-type semiconductor area 303 for the unnecessary charge discharging section 106 formed adjacently. This prevents the surplus charge from returning to the vertical charge transfer section 102.

Thereafter, an unnecessary charge remaining in the horizontal charge transfer section 103 is removed by being absorbed in the first P⁺-type semiconductor area 306 of the reset drain provided at the end of the horizontal charge transfer section 103 in a normal high-speed operation of the horizontal charge transfer section in a two-phase clock pulse shown in FIG. 7.

Subsequently, signal charges stored in the photoelectric conversion sections 101 are read out to the corresponding vertical charge transfer sections 102 based on a quantity of light incident during a predetermined time period. Thereafter, the signal charges are sent to the horizontal charge transfer section 103 for each one horizontal line transferred in a vertical direction in each vertical charge transfer section 102. Then, the signal charges are transferred in a horizontal direction in the horizontal charge transfer section 103 and are output through the output circuit 104.

In the present embodiment, the third device isolation areas 109 (the P⁺-type semiconductor area 308) for determining the electric potential of the potential barrier section by the narrow channel effect have projections extending to second device isolation area 107 (the first P⁺-type semiconductor area 306). Then, the projections of the third device isolation areas are in contact with the second device isolation area 107 connected to a metal wiring for supplying a reference potential. Accordingly, it is possible to supply a potential directly to the third P⁺-type semiconductor area 308 through the first P⁺-type semiconductor area 306 of high impurity density and low resistance.

Figure 8:
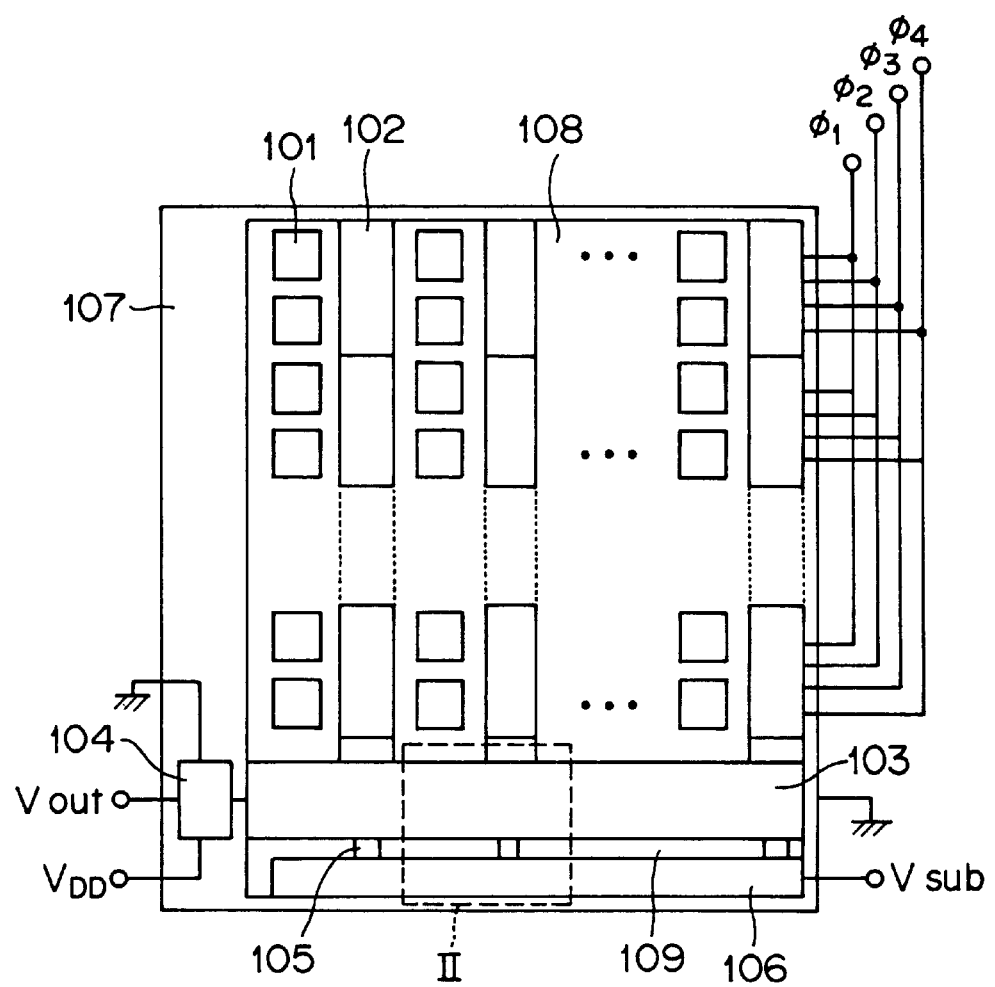
FIG. 8 is a plan view for showing a solid image pick-up device having third device isolation areas keeping no contact with a second device isolation area.
Figure 9:
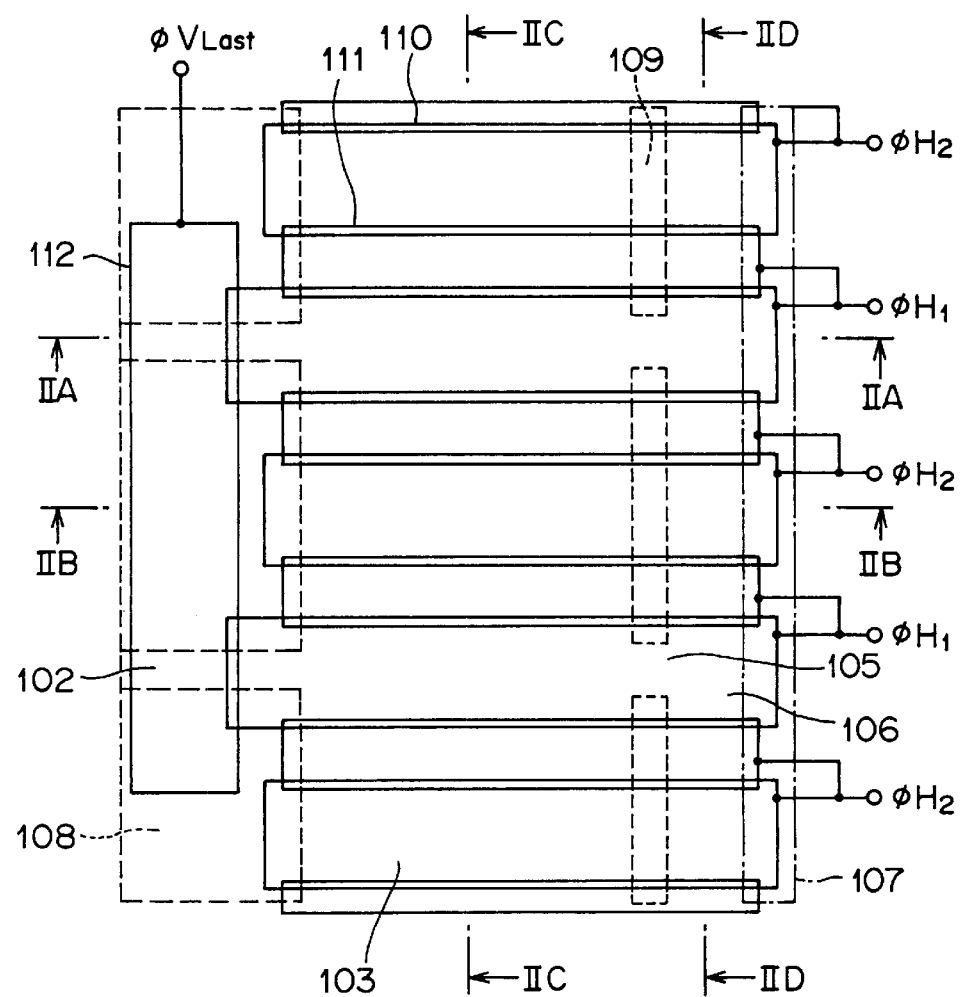
FIG. 9 is a plan view for showing an enlarged II section of the solid image pick-up device having the third device isolation areas keeping no contact with the second device isolation area.
Figure 10A:
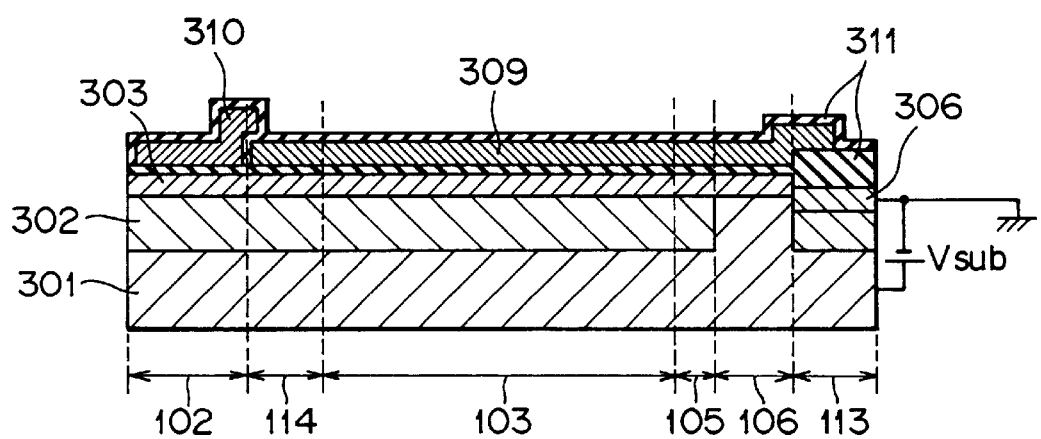
FIG. 10A is a cross sectional view along the line IIA—IIA in FIG. 9.
Figure 10B:
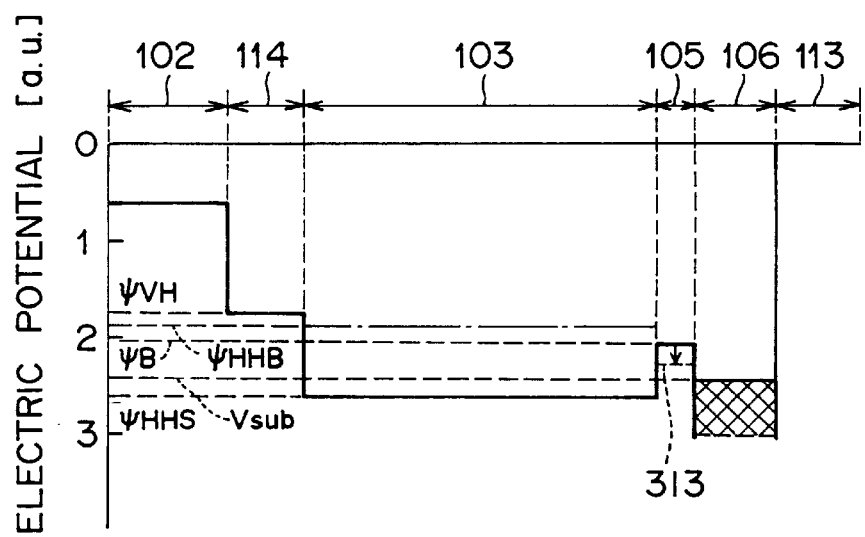
FIG. 10B is a schematic view for showing an electric potential in an area shown in FIG. 10A.
Figure 11A:
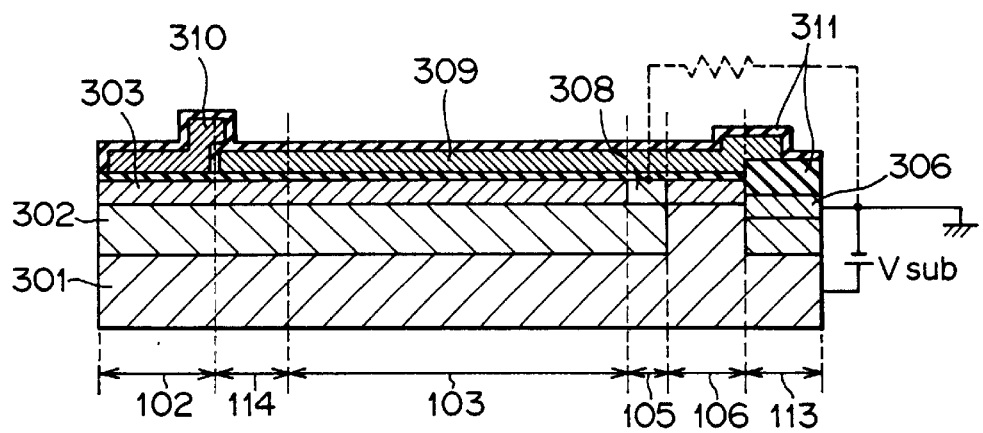
FIG. 11A is a cross sectional view along the line IIB—IIB in FIG. 9.
Figure 11B:
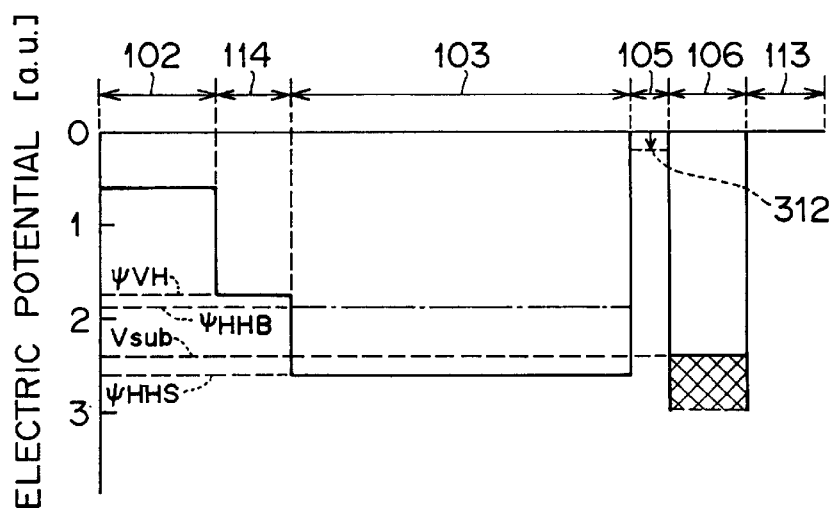
FIG. 11B is a schematic view for showing an electric potential in an area shown in FIG. 11A.
Figure 12A:
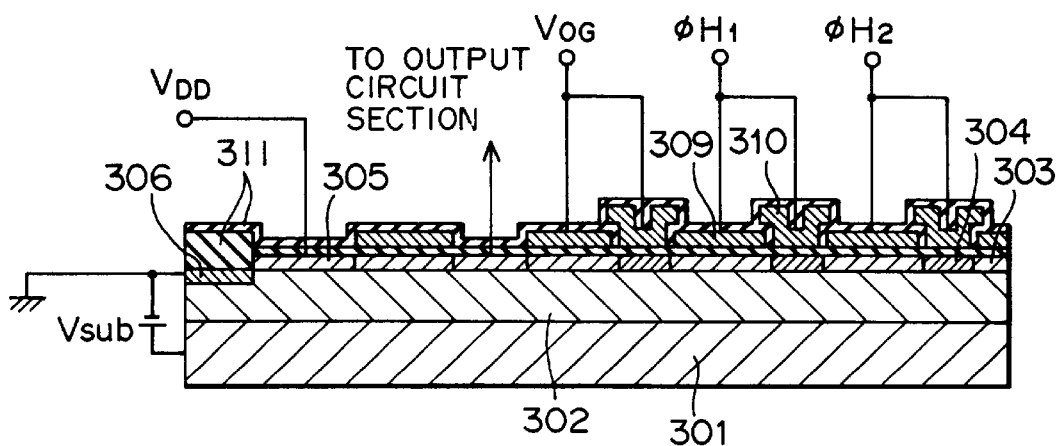
FIG. 12A is a cross sectional view along the line IIC—IIC in FIG. 9.
Figure 12B:
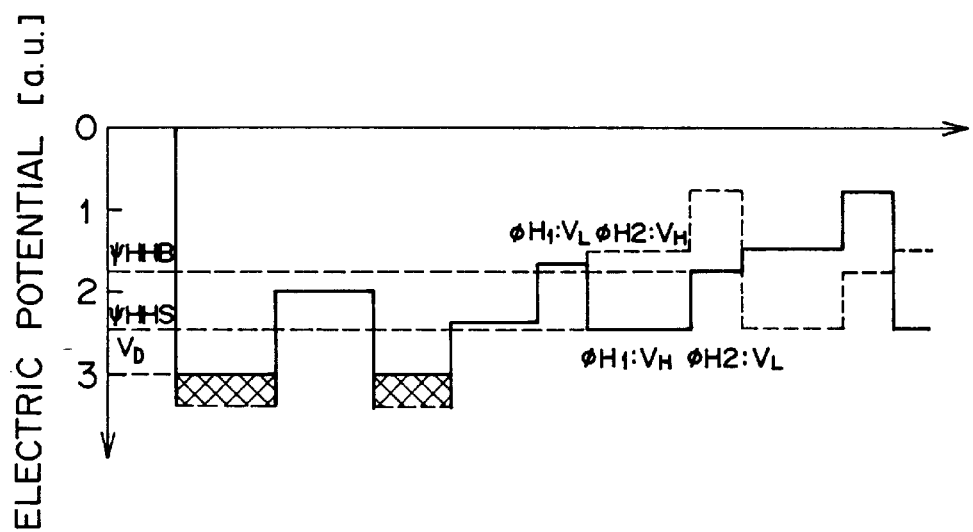
FIG. 12B is a schematic view for showing an electric potential in an area shown in FIG. 12A.
Figure 13A:
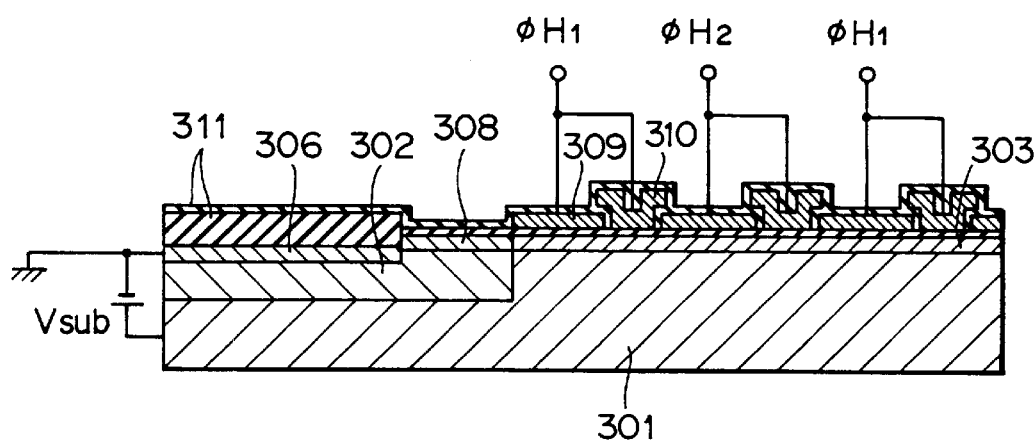
FIG. 13A is a cross sectional view along the line IID—IID in FIG. 9.
Figure 13B:
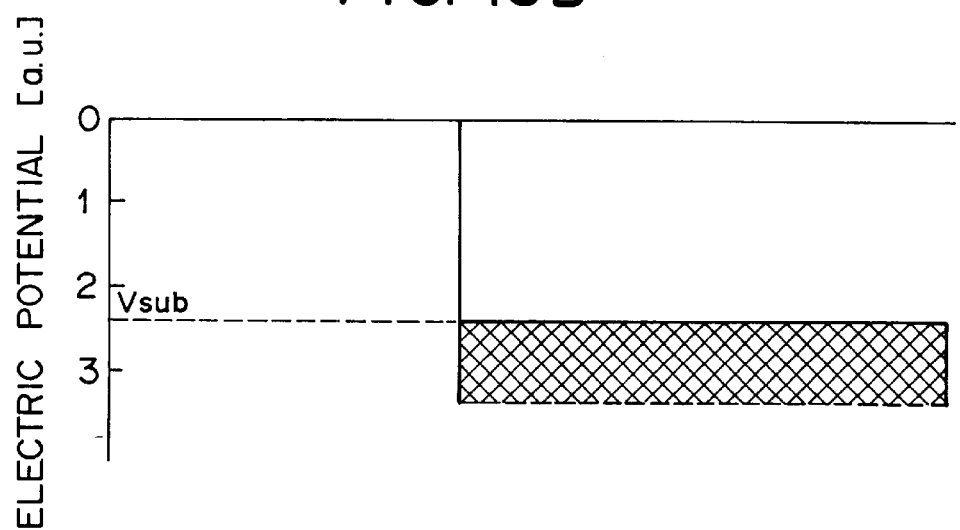
FIG. 13B is a schematic view for showing an electric potential in an area shown in FIG. 13A.

As a solid image pick-up device having a structure different from that of the first embodiment of the present invention, there is considered a solid image pick-up device having such a structure that the second device isolation area is not in contact with the third device isolation areas. FIG. 8 is a plan view for showing a solid image pick-up device having third device isolation areas keeping no contact with a second device isolation area, and FIG. 9 is a plan view for showing an enlarged II section thereof. FIG. 10A is a cross sectional view along the line IIA—IIA in FIG. 9, and FIG. 10B is a schematic view for showing an electric potential in an area shown in FIG. 10A. FIG. 11A is a cross sectional view along the line IIB—IIB in FIG. 9, and FIG. 11B is a schematic view for showing an electric potential in an area shown in FIG. 11A. FIG. 12A is a cross sectional view along the line IIC—IIC in FIG. 9, and FIG. 12B is a schematic view for showing an electric potential in an area shown in FIG. 12A. FIG. 13A is a cross sectional view along the line IID—IID in FIG. 9, and FIG. 13B is a schematic view for showing an electric potential in an area shown in FIG. 13A. In FIG. 8 to FIG. 13, like members of the first embodiment shown in FIG. 1 to FIG. 6 are designated by like reference characters, with a detailed explanation thereof being omitted.

In a solid image pick-up device shown in FIG. 8 to FIG. 13, a P-type well layer 302 with an impurity density of about $1.0 \times 10^{16}$ cm⁻³ is selectively formed in an area excluding an area of a unnecessary charge discharging section 106, in a manner similar to that in the first embodiment of the present invention. Further, areas along the line IIA—IIA and the line IIC—IIC in FIG. 9 have structures similar to those of the areas along the line IA—IA and the line IC—IC in FIG. 1 and FIG. 2 respectively.

However, in the solid image pick-up device shown in FIG. 8 to FIG. 13, third device isolation areas 109 do not extend toward an area where a second device isolation area 107 is formed and the third device isolation areas are not in contact with the second device isolation area as shown in FIG. 9 in comparison with FIG. 2. Accordingly, in an area of an unnecessary charge discharging section 106, an N-type semiconductor area 303 is formed at the surface of a semiconductor substrate 301, as shown in FIG. 11A. Similarly, only the N-type semiconductor area 303 is formed below a first polycrystalline silicon film 309 and a second polycrystalline silicon film 310 through an insulation film 311, as shown in FIG. 13A.

In the solid image pick-up device having the above-described structure, the N-type semiconductor area itself is depleted by applying an inverse bias voltage larger than the power supply voltage $V^{DD}$ of usually about 15 V to an N⁻⁻-type semiconductor substrate 301, thereby to shift all the signal charges to the N⁻⁻-type semiconductor substrate 301. With this arrangement, unnecessary charges existing in photoelectric conversion sections 101 are removed.

With the above-described operation, all the unnecessary charges existing in a vertical charge transfer section 102 are transferred together to a horizontal charge transfer section 103 in a four-phase clock pulse, for example.

In this case, a high-level voltage $V_H$ is being applied to $\Phi H_1$ and a low-level voltage $V_L$ is being applied to $\Phi H_2$ in horizontal charge transfer electrodes 110 and 111 as shown in FIG. 7. A surplus charge that cannot be stored in the horizontal charge transfer section 103 exceeds an electric potential $\Psi B$ of a potential barrier section formed to be lower than an electric potential ΨVH formed in a vertical and horizontal connection section 114, and is removed by being absorbed by the N⁻⁻-type semiconductor substrate 301 through the N-type semiconductor area 303 for the unnecessary charge discharging section 106 formed adjacently. This prevents the surplus charge from returning to the vertical charge transfer section 102.

Thereafter, an unnecessary charge remaining in the horizontal charge transfer section 103 is removed by being absorbed in the first P⁺-type semiconductor area 306 of the reset drain provided at the end of the horizontal charge transfer section 103 in a normal high-speed operation of the horizontal charge transfer section in a two-phase clock pulse shown in FIG. 7.

Subsequently, signal charges stored in the photoelectric conversion sections 101 are read out to the corresponding vertical charge transfer sections 102 based on a quantity of light incident during a predetermined time period. Thereafter, the signal charges are sent to the horizontal charge transfer section 103 for each one horizontal line transferred in a vertical direction in each vertical charge transfer section 102. Then, the signal charges are transferred in a horizontal direction in the horizontal charge transfer section 103 and are output through the output circuit 104.

In the above-described solid image pick-up device shown in FIG. 8 and FIG. 9, the potentials of the third device isolation areas 109 (the P⁺-type semiconductor area 308) for determining the electric potential of the potential barrier section by the narrow channel effect are supplied from the second device isolation area 107 (the first P⁺-type semiconductor area 306) connected to a metal wiring for supplying a reference potential, through the P-type well layer 302 with an impurity density of about $1.0 \times 10^{16}$ cm$^{-3}$.

The electric resistance of the P-type well layer 302 is extremely higher than the electric resistance of the first P⁺-type semiconductor area 306 which becomes the second device isolation area 107 and the third P⁺-type semiconductor area 308 which becomes the third device isolation areas 109. For example, while the electric resistance of the P-type well layer 302 is about 50 to 100 kΩ/□, the electric resistance of the first and third P⁺-type semiconductor areas 306 and 308 is about 0.5 kΩ/□.

Further, in the solid image pick-up device shown in FIG. 8 and FIG. 9, when a voltage is applied to the horizontal charge transfer electrode, the potential of a third P⁺-type semiconductor area 308 which becomes the third device isolation areas 109 is modulated as shown by a broken line 312 in FIG. 11B. Then, along with this modulation, the electric potential ΨB of the potential barrier section is modulated and becomes lower as shown by a broken line 313 in FIG. 10B.

However, according to the first embodiment, the third device isolation areas 109 (the P⁺-type semiconductor area 308) for determining the electric potential of the potential barrier section by the narrow channel effect are connected with the second device isolation area 107 (the first P⁺-type semiconductor area 306) connected to a metal wiring for supplying a reference potential. Accordingly, when a voltage is applied to the horizontal charge transfer sections 110 and 111, it is possible to restrict the electric potential of the third device isolation areas 109 (the third P⁺-type semiconductor area) for determining the electric potential of the potential barrier section 105 from being modulated, thus stabilizing the electric potential.

Accordingly, in the present embodiment, there occurs no reduction in the charge transfer capacity of the horizontal charge transfer section 103 which is determined by the difference between an electric potential ΨHHS of the charge storage area of the horizontal charge transfer section 103 and the electric potential ΨB of the potential barrier section 105.

Figure 14:
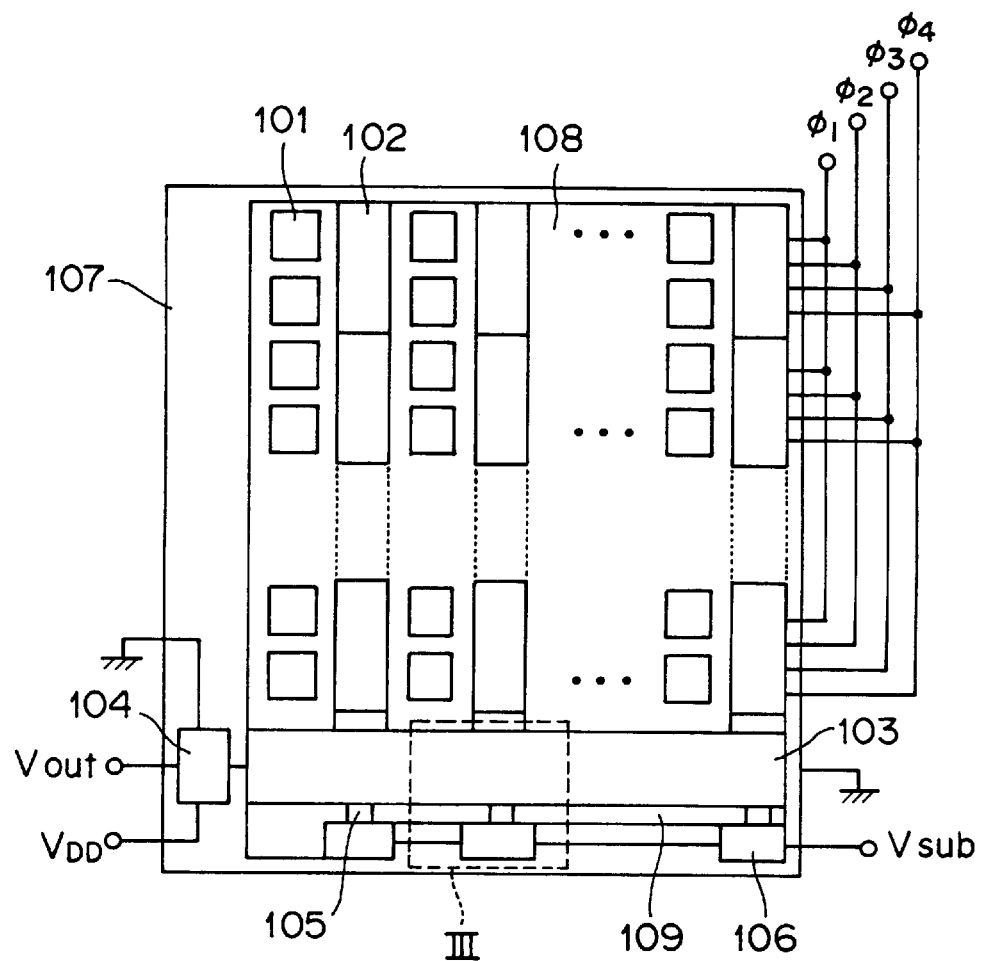
FIG. 14 is a plan view for showing a solid image pick-up device having an unnecessary charge discharging section according to a second embodiment of the present invention.
Figure 15:
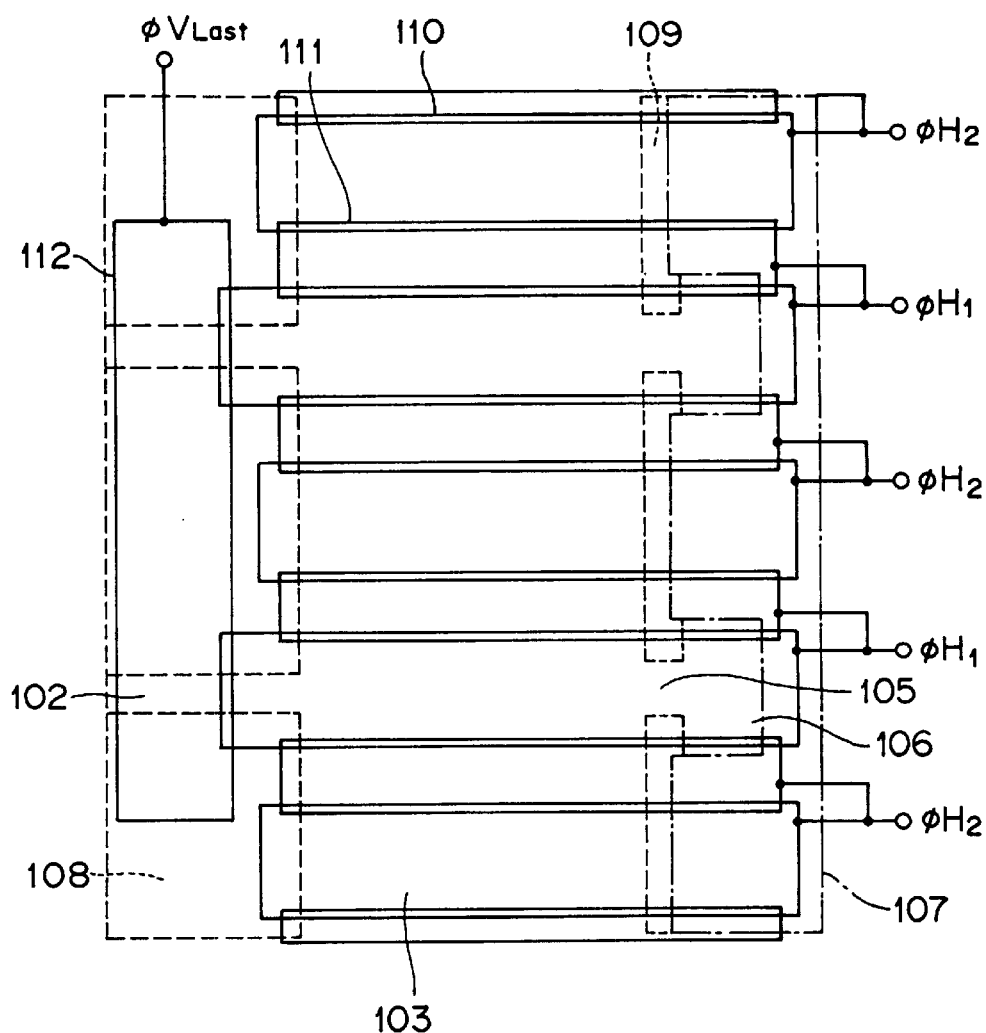
FIG. 15 is a plan view for showing an enlarged III section of the solid image pick-up device having the unnecessary charge discharging section according to the second embodiment of the present invention.

A second embodiment of the present invention will be explained next with reference to the drawings. FIG. 14 is a plan view for showing a solid image pick-up device having an unnecessary charge discharging section according to a second embodiment of the present invention, and FIG. 15 is a plan view for showing an enlarged III section of the solid image pick-up device having the unnecessary charge discharging section according to the second embodiment of the present invention. The second embodiment shown in FIG. 14 and FIG. 15 is different from the first embodiment shown in FIG. 1 and FIG. 2 in only the shapes of a second device isolation area 107 and a third device isolation areas. In FIG. 14 and FIG. 15, like members of FIG. 1 and FIG. 2 are designated by like reference characters, with a detailed explanation thereof being omitted.

In the second embodiment, the second device isolation area 107 connected to a metal wiring for supplying a reference potential have projections extending to the third device isolation areas 109 for determining an electric potential of a potential barrier section by a narrow channel effect. Then, the projections of the second device isolation area are in contact with the third device isolation areas 109.

In the solid image pick-up device according to the second embodiment of the present invention having the above-described structure, unnecessary charges can also be removed in a manner similar to that of the first embodiment, thus making it possible to obtain an effect similar to that of the first embodiment.

In the above first and second embodiments, it has been described that the second P⁺-type semiconductor becoming the first device isolation areas 108 and the third P⁺-type semiconductor area 308 becoming the third device isolation areas 109 are separate. However, in the present invention, they may be the P⁺-type semiconductor area which becomes the same device isolation area prepared in the same process.

Further, while description has been made of a buried-type charge transfer device in the above first and second embodiments, the present invention can also be applied to a surface-type charge transfer device.

What is claimed is:

1. A solid image pick-up device having unnecessary charge discharging section comprising:

a semiconductor substrate of first conductive type;

a semiconductor well layer of second conductive type formed at the surface of said semiconductor substrate;

first device isolation areas of first conductive type formed at the surface of said semiconductor well layer;

a plurality of photoelectric conversion sections formed at said first device isolation areas, said photoelectric conversion sections converting optical information into electric signals;

a vertical charge transfer section for transferring charges in a vertical direction out of said electric signals converted by said photoelectric conversion sections;

a horizontal charge transfer section for transferring charges in a horizontal direction out of said electric signals converted by said photoelectric conversion sections;

a second device isolation area of second conductive type formed in contact with said first device isolation areas, said second device isolation area having an impurity density higher than that of said semiconductor well layer;

an output circuit section formed at said second device isolation area, said output circuit section outputting charges transferred by said vertical charge transfer section and said horizontal charge transfer section;

an unnecessary charge discharging section formed at a side of said horizontal charge transfer section opposite to said vertical charge transfer section, said unnecessary charge discharging section discharging unnecessary charges of said vertical charge transfer section and said horizontal charge transfer section;

a third device isolation area of second conductive type formed in a contact with said second device isolation area between said horizontal charge transfer section and said unnecessary charge discharging section, said third device isolation area having an impurity density higher than that of said semiconductor well layer; and a potential barrier section determining electric potential between said horizontal charge transfer section and said unnecessary charge discharging section.

2. A solid image pick-up device according to claim 1, further comprising:

an insulation film formed on said potential barrier section and said unnecessary charge discharging section; and a horizontal charge transfer electrode formed on said insulation film.

3. A solid image pick-up device according to claim 1, further comprising:

a semiconductor area of first conductive type formed at the surface of said semiconductor substrate in an area where said unnecessary charge discharging section is formed, said semiconductor area structuring a buried channel of said horizontal charge transfer section.

4. A solid image pick-up device according to claim 1, wherein an impurity density of said first device isolation areas is equal to that of said third device isolation area.

5. A solid image pick-up device according to claim 1, wherein a potential difference between a voltage applied to said unnecessary charge discharging section and said electric potential of said potential barrier section is 0.5 V or above.

6. A solid image pick-up device according to claim 1, wherein said third device isolation area has a projection extending to said second device isolation area, said projection being in contact with said second device isolation area.

7. A solid image pick-up device according to claim 1, wherein said second device isolation area has a projection extending to said third device isolation area, said projection being in contact with said third device isolation area.

8. A solid image pick-up device according to claim 1, wherein a plurality of said third device isolation areas are separated in a direction to which said horizontal charge transfer section extends.

9. A solid image pick-up device according to claim 1, wherein said electric potential of said potential barrier section is determined by narrow channel effect of said third device isolation area.

10. A solid image pick-up device according to claim 1, wherein a reference voltage is supplied to said second device isolation area.

* * * * *